(12) United States Patent
Steeneken et al.

(10) Patent No.: US 8,760,233 B2
(45) Date of Patent: Jun. 24, 2014

(54) FREQUENCY SELECTION AND AMPLIFYING DEVICE

(75) Inventors: Peter Steeneken, Valkenswaard (NL); Kim Phan Le, Eindhoven (NL); Jozef van Beek, Rosmalen (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/849,278

(22) Filed: Aug. 3, 2010

(65) Prior Publication Data

US 2011/0025426 A1    Feb. 3, 2011

(30) Foreign Application Priority Data

Aug. 3, 2009   (EP) ................................. 09167109

(51) Int. Cl.
*H03B 5/30* (2006.01)
*H03B 5/32* (2006.01)

(52) U.S. Cl.
CPC ... *H03B 5/30* (2013.01); *H03B 5/32* (2013.01)
USPC .................. 331/154; 331/116 R; 331/116 M

(58) Field of Classification Search
CPC ................................. H03B 5/30; H03B 5/32
USPC ................................. 331/116 M, 116 R, 154
See application file for complete search history.

(56) References Cited

U.S. PATENT DOCUMENTS

| | | | |
|---|---|---|---|
| 5,426,374 A * | 6/1995 | Taka et al. ..................... 324/727 |
| 5,839,062 A * | 11/1998 | Nguyen et al. ................. 455/323 |
| 7,663,451 B2 * | 2/2010 | Dal Molin ..................... 333/133 |
| 7,750,745 B2 * | 7/2010 | Van Beek ................. 331/116 M |
| 8,058,940 B1 * | 11/2011 | Quevy ........................... 331/154 |
| 2009/0026882 A1 | 1/2009 | Steeneken et al. |
| 2009/0057792 A1 * | 3/2009 | Steeneken et al. ............ 257/415 |
| 2010/0277262 A1 * | 11/2010 | Phan Le et al. ............... 333/219 |
| 2011/0193449 A1 * | 8/2011 | Phan Le et al. ............... 310/317 |

FOREIGN PATENT DOCUMENTS

| | | |
|---|---|---|
| WO | WO 2004/053431 | 6/2004 |
| WO | WO 2007/036820 | 4/2007 |
| WO | WO 2007/036852 | 4/2007 |
| WO | WO 2008/146244 | 12/2008 |
| WO | WO 2009/066203 | 5/2009 |

OTHER PUBLICATIONS

European Search Report dated Jan. 19, 2010.
Chinese language office action dated Jan. 22, 2013.

* cited by examiner

*Primary Examiner* — Arnold Kinkead
*Assistant Examiner* — Richard Tan
(74) *Attorney, Agent, or Firm* — McClure, Qualey & Rodack, LLP

(57) ABSTRACT

A frequency selection device comprises an oscillator, which comprises a resonator mass which is connected by a spring arrangement to a substrate, and a piezoresistive element for controlling oscillation of the resonator mass, which comprises a piezoresistive element connected to the resonator mass. A current is driven through the piezoresistive element to control oscillation of the resonator mass. An input is provided for coupling a signal from which a desired frequency range is to be selected, to the resonator mass; and a detector is used for detecting a signal amplified by the oscillator.

18 Claims, 11 Drawing Sheets

FREQUENCY SELECTION AND AMPLIFYING DEVICE

This application claims priority to EPO Patent Application No. 09167109.9 filed Aug. 3, 2009, the entire disclosure of which is herein expressly incorporated by reference.

FIELD OF THE INVENTION

This invention relates to frequency selection devices, for example a radio receiver circuit. In particular, this invention relates to a radio circuit which makes use of a MEMS resonator structure.

BACK OF THE INVENTION

A radio circuit makes use of a frequency-selective circuit and amplifying device. It has been proposed to make use of MEMS oscillators in the frequency selection and amplifying circuit.

Oscillators based on MEMS resonators are being intensively studied in many research groups and some first products have recently been released. MEMS resonator devices offers high Q-factor, small size, high level of integration and potentially low cost. These devices are expected to replace bulky quartz crystals in high-precision oscillators.

Such oscillators are widely used in time-keeping and frequency reference applications such as RF modules in mobile phones, devices containing blue-tooth modules and other digital and telecommunication devices. Since the oscillation frequency can depend on mass, temperature, acceleration or magnetic field, the oscillators can also be used as very sensitive sensors. The oscillators can also be used as actuators for example as an oscillating mirror to deflect a laser beam or to pump gases or liquids.

The conventional MEMS-based oscillator is shown schematically in FIG. 1.

Basically it consists of a MEMS resonator 10 and an external amplifier circuit 12. The MEMS resonator 10 consists of a silicon mass-spring system, which can be excited into mechanical resonant vibration, and means to sense this vibration and to convert it into an electrical signal. The electrical signal is fed into the amplifier circuit 12. This circuit basically consists of a gain amplifier 14 and a phase shifter 16. The output of the amplifier is fed back into the actuation side of the resonator. If the total loop gain is larger than one and the loop phase shift is zero, the oscillation can be maintained within the loop.

There are several ways to sense the signal and to actuate the resonator. In most MEMS resonators, excitation is done by electrostatic actuation and sensing is done by capacitive or piezoresistive method. In some cases, the actuation can be done by the piezoelectric or thermal expansion.

The conventional oscillators based on a MEMS resonator and an external circuit have a number of problems. Most significantly, the device must be built up from two separate parts: the MEMS resonator device and the (transistor-based) amplifier circuit. The two parts are normally built on separate dies or ultimately can be integrated on a single Si die, but the technologies and processes for the two parts are essentially different. Unless the amplifier circuit can be put on the same area as the resonator, the combined device will be larger than the resonator alone. Consequently there are further problems, such as significant power needed for the amplifier and further circuit blocks (e.g. phase shifter, buffer, charge pumps to generate a DC bias voltage for the resonator). These additional circuits give rise to the presence of parasitic capacitance due to bonding wires, and bond pads cause extra undesired phase shifts and/or loop losses.

Most MEMS resonators use electrostatic actuation. The efficiency of the actuation can be indicated by the electromechanical coupling efficiency η:

$$\eta = \frac{\varepsilon_0 A V_{dc}}{g^2}$$

in which A is the electrode area, $V_{dc}$ is the DC bias voltage that needs to be applied on the electrodes to create actuation force (besides an AC voltage) and g is the width of the transduction gap between the electrodes.

From this formula it is clear that the electrode area must be maximized and the gap size must be minimized to assure a good coupling efficiency. Because A is determined by the thickness of the MEMS structure and the length of the electrode, the above requirement means that a transduction gap with a very high aspect ratio is required. The technique used to realize such high aspect ratio gaps (or trenches) is one of the most difficult steps in the entire process.

Another disadvantage of using electrostatic actuation is that it results in an intrinsically non-linear signal, since the electrostatic force depends not just on voltage but also on the displacement. The bias voltage must also be relatively high, in the order of 5V up to a few tens of V, which requires charge pump stages on chip.

This invention relates specifically to the use of MEMS oscillator structures within frequency selection circuits, such as radio circuits, and addresses the problems above which relate to MEMS oscillators generally, for example in order to enable a micro radio to be implemented.

SUMMARY OF THE INVENTION

According to the invention, there is provided a frequency selection device, comprising:

a resonator mass which is connected by a spring arrangement to a substrate;

a feedback piezoresistive element for controlling the response of the motion of the resonator mass to an input signal connected to the resonator mass and which is arranged such that the strain in the piezoresistive element varies in response to movement of the resonator mass, and a change in strain in the piezoresistive element causes a change in electrical resistance; and means for driving a current through the piezoresistive element to control the response of the motion of the resonator mass to the force generated from the input signal;

an input for coupling the input signal from which a range of desired frequencies is to be selected to the device such as to influence the motion of the resonator mass; and a detector for detecting an output signal amplified and filtered by the resonator by measuring the change in the voltage across or the current through the piezoresistive element for detecting said change in electrical resistance.

The invention provides a frequency selection circuit which uses the structure of an oscillator in which the two main parts (resonator and circuit to close the oscillation loop) are combined inside one single resonator device, which can be a MEMS device. The device consists of a mass-spring system like the conventional resonator and, besides, one or more feedback piezoresistive elements which can also be made within the MEMS structure. The whole frequency selective device can be made out of a material of homogeneous composition. The piezoresistive elements sense the strain from the motion (which is in the form of a vibration) by a piezoresistive signal, which is a change in a current or voltage caused by the piezoresistive effect, and convert this piezoresistive signal into mechanical stress within themselves, using the thermal expansion effect (resulting from the temperature changed caused by a change in electrical energy dissipation), to positively feed back into the mechanical vibration. In this way, an oscillation loop can be closed within the same resonator structure, without having to use any external circuit and without using transistors. Furthermore, the use of the thermal expansion effect for actuation eliminates the need to make difficult transduction gaps between actuation electrodes and the resonator mass. The piezoresistive element can be connected between the resonator mass and the substrate, or between multiple resonator masses, as long as the mode of vibration of the resonator mass results in changes in strain, which in turn can be used to provide feedback control.

The oscillator structure operates by converting mechanical motion of the resonator mass to changes in strain in the piezoresistive element. This causes a change in resistance of the piezoresistive element. As a current flows through the piezoresistive element, this change in resistance causes a change in the electrical energy that is dissipated ($P=I^2R$), which causes a change in temperature. The change in temperature causes a thermal expansion force, which provides a mechanical feedback function to provide feedback control of the vibration of the resonator mass. Thus, the piezoresistive element is adapted to convert resonator mass movement into heating, and to convert the heating into thermal expansion thereby providing a mechanical feedback function. It should be noted that since the piezoresistive heating effect and thermal expansion effect are present in almost every material, no special arrangements or materials are required, and the arrangement is essentially implemented by appropriate selection of the geometry of the components.

By providing an input for coupling an input signal to the device, the device functions as a regenerative (amplifying) detector for a narrow frequency band which is dependent on the resonance frequency of the oscillator structure. This enables a low cost and miniature detector/tuner to be formed. A regenerative circuit (or self-regenerative circuit) allows an electronic signal to be amplified many times by the same active component and also to be filtered many times by the same filter. In this case the active component is an amplification by the piezoresistive effect and the filter is the high-Q mechanical resonator. Their use of positive feedback greatly increases both the selectivity and sensitivity of a simple receiver. Positive feedback builds up the input signal to very high levels, which will be well known to those skilled in the art of regenerative circuits.

A current source can be provided for supplying current to the piezoresistive element (constant current operation, in which the current is kept substantially constant), or a voltage source can be used to supply a voltage (constant voltage operation in which the voltage is kept substantially constant). The current source has two functions, it is heating the piezoresistive feedback element and it used to detect the resistance change of the element. The heating power is proportional to the product of current and voltage across the beam. Both a DC current and a high frequency AC current can be used to heat the element, because if the frequency is high enough compared to the thermal time constant of the element, the temperature of this element will only depend on the root-mean-squared (rms) value of the AC current.

The piezoresistive feedback element needs to be heated such that a resistance change of the element results in a change in the thermal expansion of the element. For the detection of the resistance change of the element, a DC current will result in an output voltage which is proportional to the resistance change. An AC current will be mixed with the piezoresistance change signal and can thus be used for frequency demodulation of the signal as described in: PCT patent application PCT/IB2009/052614.

The resonator mass can be connected to the substrate by at least two arms which together form the spring arrangement, wherein a first arm comprises the piezoresistive element and a second arm comprises a current return path for the piezoresistive element. In this way, the spring arrangement and feedback piezoresistive elements are implemented by the same structure.

In one implementation, the first, piezoresistive element, arm is doped with a first doping level, and the second arm is doped with a second, higher doping level. The two arms are essentially the same material, for example silicon, but the different doping levels provide the implementation of a single feedback piezoresistive element. In another arrangement, the first, piezoresistive element, arm is smaller in cross section than the second arm. This again defines different piezoresistive properties.

The resonator mass and the piezoresistive element can comprise a single body. Similarly, the resonator mass and the spring arrangement can comprise a single body. This body can be a silicon body, enabling standard MEMS manufacturing technology to be used.

The input preferably comprises an electrode which is electrostatically coupled to the resonator mass, such that an input voltage generates an electrostatic force on the resonator mass. Alternatively the input can also be coupled by piezoelectric, electrothermomechanical (thermal expansion) force, Lorentz force, magnetostatic force or other electromagnetic forces to the resonator mass.

The means for driving a current through the piezoresistive element can for example generate a DC driving current, but might also be a sinusoidal driving AC current of fixed frequency if this frequency is much above the oscillation frequency of the oscillator structure. The driving current can also be a DC current with a superimposed low frequency AC signal if the AC frequency is high enough to prevent the start-up of sustained oscillations, in this implementation the circuit operates in a super-regenerative mode instead of a regenerative mode and provides even more gain and selectivity because the absolute current level can be above $I_{osc}$. The root mean squared current level is selected below the minimum current $I_{osc}$ required to drive a sustained oscillation of the resonator mass. The DC driving current level $I_{DC}$ can be adjusted to adjust the amplification and frequency selectivity of the circuit. The selectivity of the circuit can be tuned between a filter with a Q equal to the intrinsic $Q=Q_{int}$ of the resonator mass and Q=infinity. The effective $Q_{eff}$ determining the selectivity of the filter is given by the equation:

$$1/Q_{eff}=1/Q_{int}(1-I_{DC}^2/I_{osc}^2)$$

The output signal will be approximately proportional to IDC*Qeff=IDC*Qint/(1−IDC2/Iosc2). For large gain and selectivity it is thus desirable to have 0.9 $I_{osc}<I_{DC}<I_{osc}$. On the other hand care must be taken to prevent sustained oscillation and to prevent a too high-Q (if the filter selectivity is too high, the filter bandwidth might become smaller than the channel bandwidth such that it is not possible to receive the full channel). It might be desirable to implement a detection feedback circuit which reduces or optimizes $I_{DC}$ by detecting sustained oscillations of the resonator mass.

The range of desired frequencies preferably comprises at least one of the resonance frequencies of the resonator mass.

The frequency selection device can be used in a radio receiver circuit. A radio receiver can then comprise a plurality of radio receiver circuits of the invention, each designed for a different range of desired frequencies. The miniaturization that is possible means that a full bandwidth radio receiver can be formed from many (of the order of hundreds) individual receivers, which then can have fixed drive conditions. Only the individual receiver with the desired/required desired frequency range needs to be driven.

The invention also provides a method of selecting and amplifying a desired frequency range from an input signal, comprising:

driving a current through a piezoresistive element;

controlling the motion of a resonator mass using the piezoresistive element, which is arranged such that the strain in the piezoresistive element varies in response to movement of the resonator mass, and a change in strain in the piezoresistive element causes a change in electrical resistance;

coupling the input signal from which a desired frequency range is to be selected to the device such as to influence the motion of the resonator mass; and detecting a signal amplified and filtered by the device by measuring the change in the voltage across or the current through the piezoresistive element for detecting said change in electrical resistance.

BRIEF DESCRIPTION OF THE DRAWINGS

The invention will now be described in detail with reference to the accompanying drawings, in which.

DETAILED DESCRIPTION OF EMBODIMENTS

The invention provides a frequency selection circuit which functions as a regenerative detector. It combines the structure of a MEMS oscillator (although not driven to oscillate in conventional manner) and an actuation electrode which couples a signal from which a desired frequency range is to be selected/amplified.

The circuit is based on an oscillator structure in which vibration of a resonator mass is controlled by a piezoresistive element. The way this oscillator device functions will first be described before explaining the invention. Although the oscillator device structure is used in the invention, the control of the device avoids oscillation.

In the oscillator device used in the circuit of the invention, three physics phenomena are coupled: thermal, electrical (e.g. piezoresistive) and mechanical.

Figure 1:
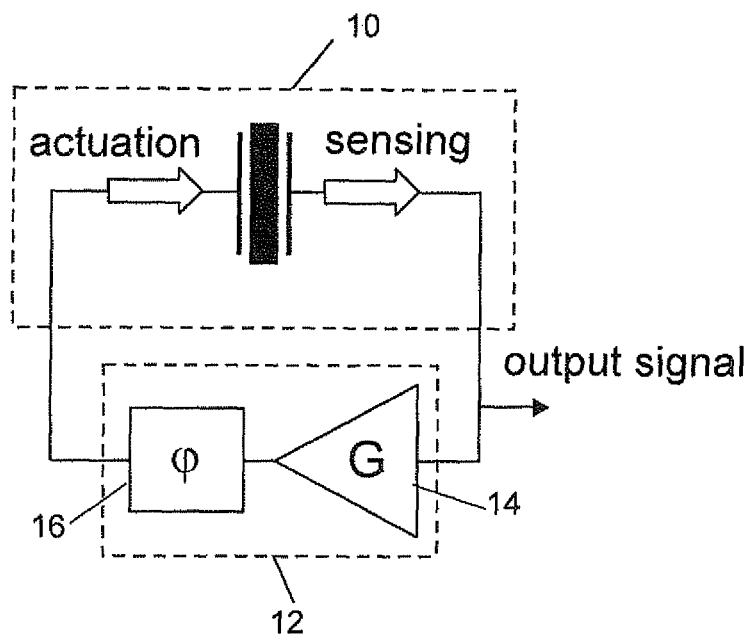
FIG. 1 shows in schematic form a known MEMS oscillator arrangement.
Figure 2:
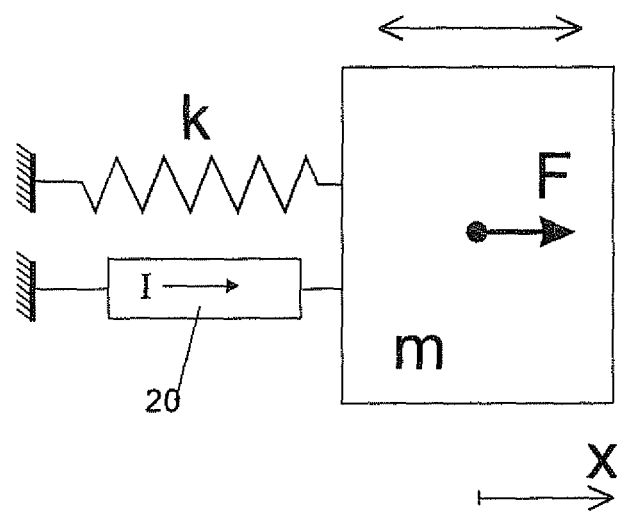
FIG. 2 is used to explain the general principles underlying the oscillator device which can be used in the circuit of the invention.

FIG. 2 is a simplified schematic diagram of the oscillator device used in the circuit of the invention. The device consists of a mass-spring system (m denotes the effective mass and k denotes the effective spring stiffness) and one or more feedback piezoresistive elements 20. These elements function as both sensing and actuation elements, as they provide the control of the oscillation, but can also provide the electrical oscillating signal output from the device.

The piezoresistive elements 20 connect the mass to the fixed frame of the device, namely the substrate. In reality the sensing-actuation elements and the mass can be the spring itself or a part of the spring. In FIG. 2 and in the detailed explanation below, only one piezoresistive element 20 is shown and discussed for the sake of simplicity.

The piezoresistive element 20 is made of a piezoresistive material, for instance p- or n-doped Silicon. The piezoresistive element in this case is preferably made of the same material and with the same process as the mass-spring system, but this is not essential.

During operation, a DC current, I, is sent through the piezoresistive element 20. The return path for the current is not shown in FIG. 2, but examples are given below. The device is designed in such a way that during vibration of the mass, the piezoresistive element is substantially compressed and stretched. The operation principle of the device can be explained as follows.

The mass-spring system can resonate at its natural angular frequency:

$$\omega_0 = \sqrt{\frac{k}{m}} \tag{1}$$

and with the quality factor Q, the inverse of which (1/Q) determines the fractional energy loss per cycle due to damping. To sustain the oscillation, this loss must be compensated by the oscillation loop. In the device of the invention, the compensation is fulfilled by means of the piezoresistive element.

Assuming a constant voltage V is applied to the piezoresistive element that causes a current I flowing through the element, and the element has the piezoresistive property with a positive gauge factor K. During the first quarter of a vibration cycle, the mass is assumed to move towards the fixed frame (substrate), that compresses the piezoresistive element. This means that the element experiences negative strain $\epsilon$:

$$\epsilon = x/l \quad (2)$$

in which l is the length of the piezoresistive element and x is the displacement of the moving end of the piezoresistive element (x<0), thus also the displacement of the mass (the mass is considered a solid structure).

Due to the piezoresistive effect, the resistance of the element decreases, according to:

$$R = R_{dc}(1+K\epsilon) \quad (3)$$

in which $R_{dc}$ is the resistance of the element at zero strain. Because the Joule heating power is $$P_{Joule} = V^2/R = \frac{V^2}{R_{dc}(1+K\epsilon)} \approx \frac{V^2}{R_{dc}}(1-K\epsilon) = P_{dc}(1-K\epsilon) \quad (4)$$

In the above formula, the approximation can be taken since $K\epsilon \ll 1$.

With the constant voltage V and positive K, $P_{Joule}$ increases as the element is compressed ($\epsilon$<0). Consequently the temperature of the element is increased compared to its previous temperature at zero strain. Due to the thermal delay, which is inevitable due to finite heat capacitance and heat conductance, the change in temperature slightly lags behind the change in strain. The change in temperature, T, directly causes stress $\sigma$ in the element due to the thermal expansion effect:

$$\sigma = E\alpha T \quad (5)$$

in which E is Young's modulus and $\alpha$ is the thermal expansion coefficient of the piezoresistive element. This stress results in a force:

$$F = \sigma A = \epsilon \alpha T A \quad (6)$$

where A is the cross section of the piezoresistive element. This force pushes the mass back in the tensile direction of the element, that helps the mass to move back in the second and third quarters of the vibration cycle. Note that in this model it is assumed that there is no delay between temperature and force.

A similar mechanism but in the opposite direction happens for the third and fourth quarters of the cycle, which helps the mass to move back after it reaches the furthest position. In this way, the vibration of the mass-spring system can be positively fed back and the oscillation can be maintained.

In order to fulfill the oscillation condition there must be some phase lag $\phi$ between the displacement and the force, i.e. between the strain and the temperature of the element. In the ideal oscillator, this phase lag is 90 o, but as will be shown later, this is not essential or practically realisable.

Figure 3:
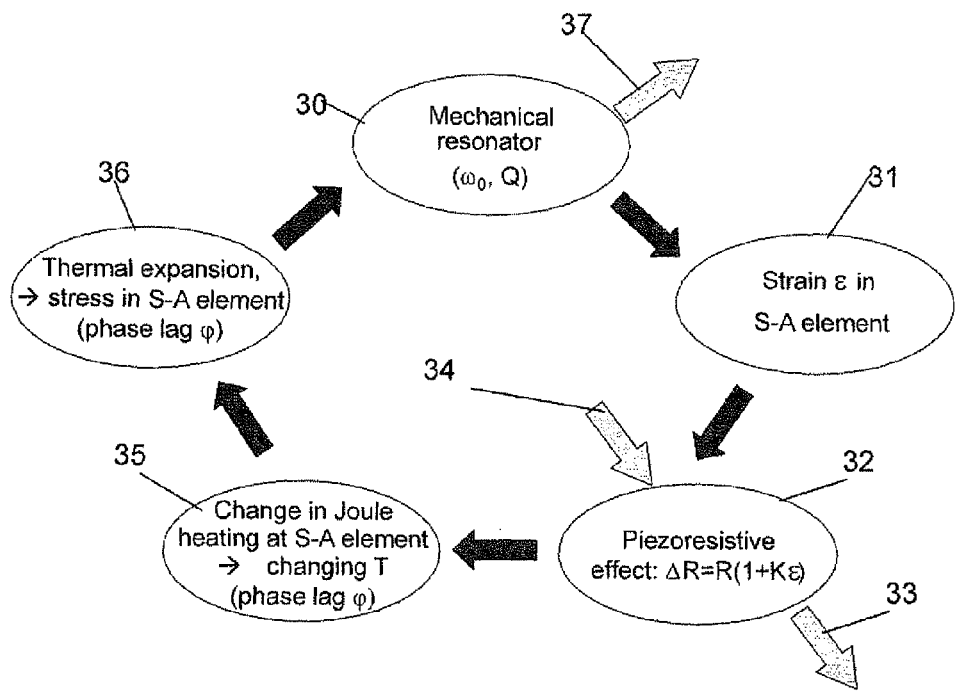
FIG. 3 is used to explain in more detail the physics underlying the operation of the oscillator.

FIG. 3 presents an overview of the physics of the oscillation loop that takes place inside the device.

Movement of the resonator mass is shown as effect 30. This induces strain in the piezoresistive element, as shown by 31. The piezoresistive effect shown at 32 results in energy loss 33 dissipated as heating, in response to a power input 34 (the current supply). This causes a change in temperature with a time lag, as shown as effect 35. Thermal expansion results (effect 36) which then provides a mechanical feedback function to influence the vibration of the resonator mass at 30. There is energy loss 37 due to the resulting damping.

Thus, the device functions by sensing the strain from the mechanical vibration of the mass-spring system using the piezoresistive effect, and this is directly converted into stress using the thermal expansion effect. The stress acts as the actuation force to feed back to the mechanical vibration. The oscillation loop is thus closed within the MEMS device itself and therefore there is no need to use an external amplifier circuit.

To understand further the principle, and to find the optimum oscillation conditions, an elaborated model is presented below.

The starting point is the common equation of motion for the device:

$$m\ddot{x} + \gamma\dot{x} + kx = F \quad (7)$$

in which $\gamma$ is the damping factor:

$$\gamma = \frac{\omega_0 m}{Q} \quad (8)$$

and F is the force acting on the mass, in this case the thermal expansion force. Combining (2), (6) and (8) gives:

$$m\ddot{\varepsilon} + \gamma\dot{\varepsilon} + k\varepsilon = \frac{AE\alpha}{l}T \quad (9)$$

On the other hand the Joule power P dissipated in the piezoresistive element is related to the temperature increase by the following equation:

$$C\dot{T} + GT = P \quad (10)$$

in which C is the heat capacity and G is the heat conductance of the piezoresistive element.

To solve the two coupled differential equations (9) and (10), it can be supposed that their solutions are in the following form:

$$T = T_{dc} + T_0 e^{j\omega t}$$

$$\epsilon = \epsilon_{dc} + \epsilon_0 e^{j\omega t} \quad (11)$$

By combining (9), (10) and (11), the loop gain $G_{loop}$ be derived:

$$G_{loop} = -\frac{\alpha AEKP_{dc}}{kl} \cdot \frac{1}{(j\omega C + G)\left(1 - \frac{\omega^2}{\omega_0^2} + j\frac{\omega}{Q\omega_0}\right)} \quad (12)$$

For sustaining the oscillation, the following two conditions must be satisfied:

$$Im G_{loop} = 0$$

$$Re G_{loop} \geq 1 \quad (13)$$

That finally leads to:

$$\omega = \omega_0 \sqrt{1 + \frac{G}{Q\omega_0 C}} \quad (14)$$

and:

$$Re\frac{1}{G_{loop}} = \frac{kl}{\alpha AEKP_{dc}} \frac{G}{Q}\left(\Psi + \frac{1}{\Psi} + \frac{1}{Q}\right) \quad (15)$$

in which $$\Psi = \frac{G}{\omega_0 C}$$

is a dimensionless parameter.

Figure 4:
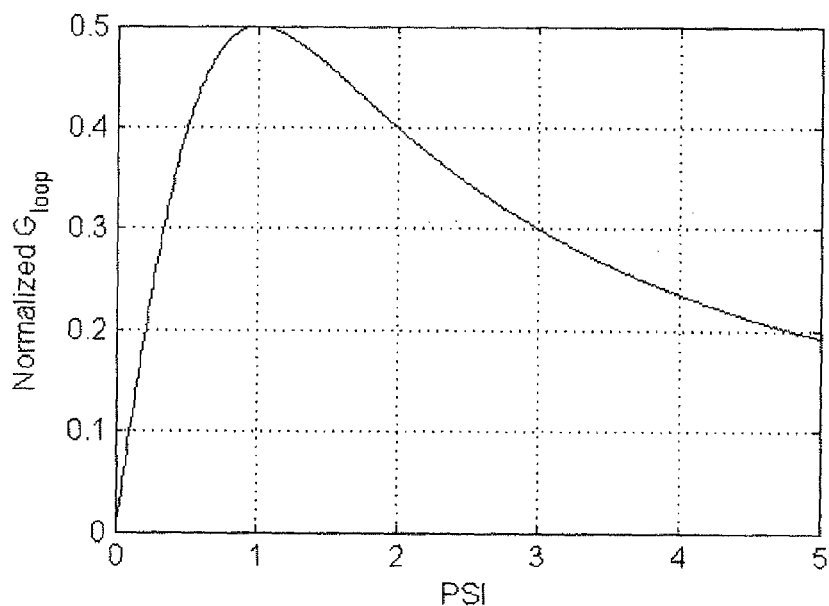
FIG. 4 is a graph to show loop gain.

FIG. 4 shows the real loop gain (normalized to $$\frac{\alpha A E K P_{dc} Q}{klG}$$

plotted against $\Psi$ (Psi), which shows that the loop gain is maximum when $\Psi=1$, or:

$$\frac{G}{\omega_0 C} = 1 \quad (16)$$

At this $\Psi$ value, the best oscillation condition is achieved. The maximum loop gain is:

$$ReG_{loop} = \frac{\alpha A E K P_{dc}}{2kl} \frac{Q}{G} \quad (17)$$

Figure 5:
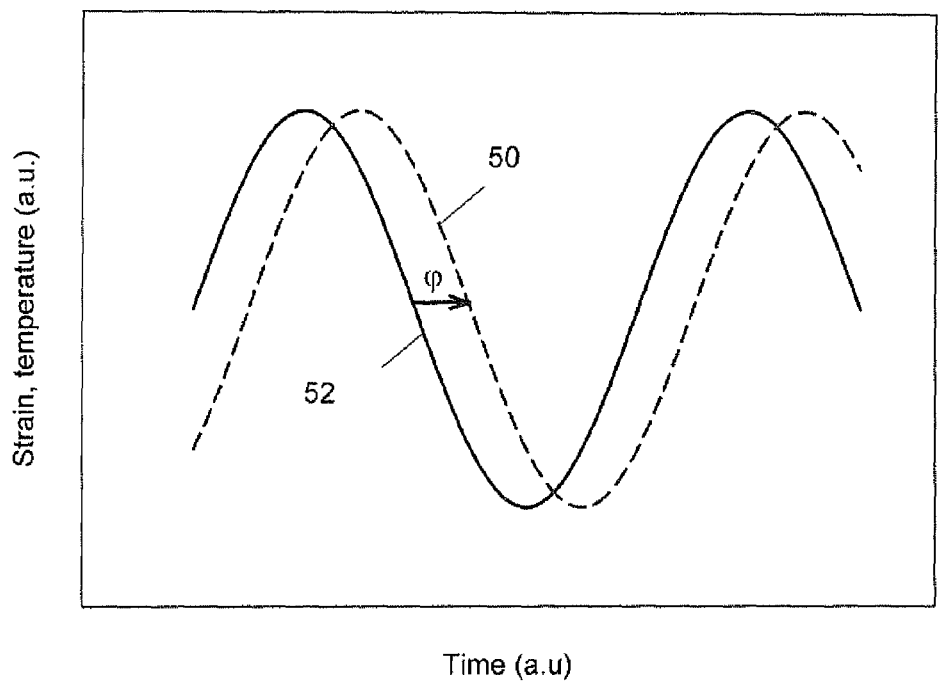
FIG. 5 is a graph to show how temperature and strain vary over time.

At this condition the phase of the temperature change is $\phi=45$ degrees lagging behind that of the strain. FIG. 5 is used to explain qualitatively the phase shift between the strain and temperature at the piezoresistive element. Plot 50 is the temperature over time, and plot 52 is the strain. The condition $\Psi=1$ can be achieved by choosing a proper set of G and C in the relation with the intended resonant frequency. Furthermore G and C can be tuned by tuning the dimensions of the piezoresistive element.

If the piezoresistive element has a shape of a rectangle, the heat capacity and the heat conductance of the element can be approximated as:

$$G = 4\kappa \frac{A}{l} \quad (18)$$
$$C = c_s \rho A l$$

in which $\kappa$ is the specific heat conductivity, $\rho$ is the mass density and $c_s$ is the specific heat capacity of the material.

The condition $\Psi=1$ can now be rewritten:

$$\omega_0 l^2 = \frac{4\kappa}{c_s \rho} \quad (19)$$

The right hand side of equation (19) is determined by the material properties, and therefore can be considered substantially fixed. To satisfy (19), only the length of the piezoresistive element must be tuned, for a given frequency.

In the above analysis, it is supposed that a constant voltage V is applied on the piezoresistive element. To make the device oscillate (i.e. the loop gain should be positive), the gauge factor K should be positive, as suggested by equation (15). Alternatively, if a constant current I, instead of a constant voltage, is applied on the piezoresistive element, this gives:

$$P_{Joule} = I^2 R = I^2 R_{dc}(1+K\epsilon) = P_{dc}(1+K\epsilon) \quad (20)$$

In order to make the loop gain positive the gauge factor K must be negative.

The sign of the piezoresistive gauge factor of Silicon can be set easily by choosing the right doping type: it is positive when Silicon is p-doped and negative when Silicon is n-doped. The magnitude of K depends on several factors, such as crystal orientation, dope concentration and temperature.

Due to the direct thermal-mechanical coupling in the actuation method and the absence of an external amplifier circuit, the proposed thermal-electro-mechanical oscillator can operate at low power. From (17), (18) and (19), the lowest power consumption for the optimum oscillation condition can be determined:

$$P_{dc} \geq \frac{4\sqrt{c_s \rho \kappa}}{\alpha K} \frac{A\sqrt{\omega_0}}{Q} \quad (21)$$

The first part of (21) depends only on the material properties and temperature; the second part is design-dependent. For example, an oscillator made of silicon having a resonant frequency of 1 MHz, a cross-sectional area of the piezoresistive element of 1.5×2 $\mu m^2$, and Q of 50,000 will in principle work with a minimum DC power of 13 $\mu W$.

There are many different possible configurations for the spring arrangement, piezoresistive element and resonator mass. A number of possible arrangements will now be outlined, although it will be understood that the examples below are not meant to be exhaustive.

Figure 6:
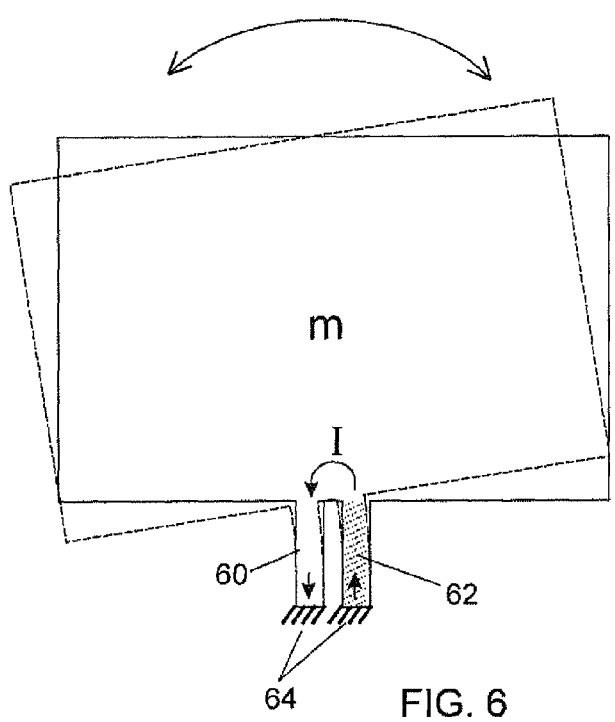
FIG. 6 shows a first example of oscillator which can be used in the circuit of the invention.

FIG. 6 shows a first embodiment comprising the resonator mass m, and two beams 60, 62 connecting the mass to the fixed substrate via two anchor points 64. The whole structure, except for the two anchors, is free standing. In FIG. 6, only the top view (2D) of the device is shown. It should be understood that the structure in reality extends to the third dimension and the plane of the 2D layout is in the plane of the substrate. The structure is made of silicon. For example the structure can be made on a Silicon-On-Insulator (SOI) substrate, using the standard process for MEMS resonators. During fabrication of the structure, one beam 62 is lowly doped in such a way that the piezoresistive gauge factor is maximized. The other beam 60 and the rest of the mass m (or at least the region at the connection between the two upper ends of the beams) are highly doped to make a short connection.

When a DC current, I, flows from one anchor to the other anchor, the electrical path can be represented by two resistors connected in series: the resistor 62 has relatively high resistance and large piezoresistive effect (due to low doping) and the resistor 60 has very low resistance (due to high doping), which can be considered a short. At the highly doped beam 60, the piezoresistive effect is very small and can be ignored.

In this structure, both two beams contribute to the spring stiffness and only the right beam (having the piezoresistive effect) serves as the piezoresistive element.

For this structure, the swinging mode is the vibration mode of interest (the mass wobbles sideways in the plane of the drawing). The dimensions of the beams and mass are chosen such that the oscillation condition according to the above analysis is satisfied. When the mass vibrates in the swinging mode, the two beams are alternatively compressed and stretched. According to the above principle, this vibration mode is amplified and finally leads to a steady oscillation state.

Figure 7:
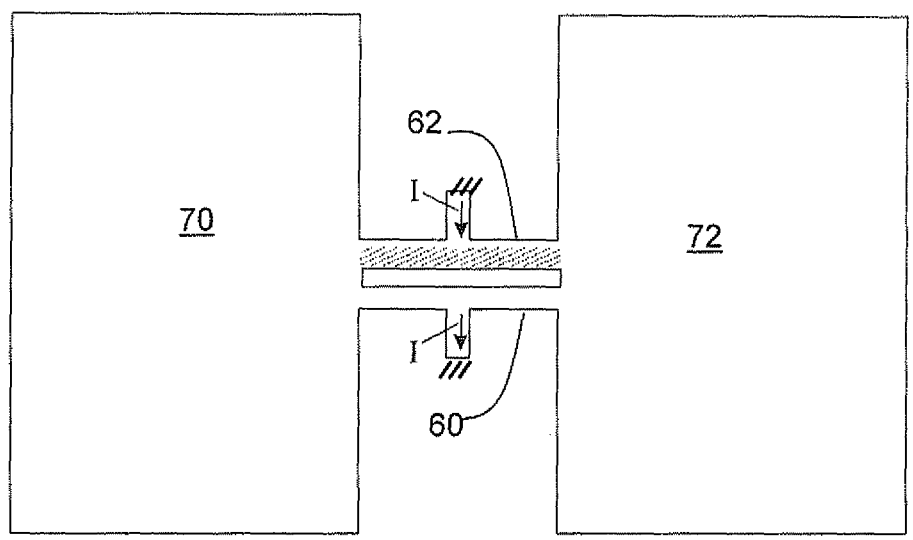
FIG. 7 shows two oscillators of the type shown in FIG. 6 coupled together.

To minimize the anchor loss, thus maximize the Q-factor, two identical oscillators can be positioned back-to-back in a symmetrical configuration, as shown in FIG. 7. This shows two resonator masses 70,72 coupled together by the two arms, with a mid point of each arm being coupled to the substrate and thus defining the anchor point.

This method of connected resonator masses back to back can be applied to all examples described below, but for simplicity further examples show the simplest possible configuration.

Figure 8:
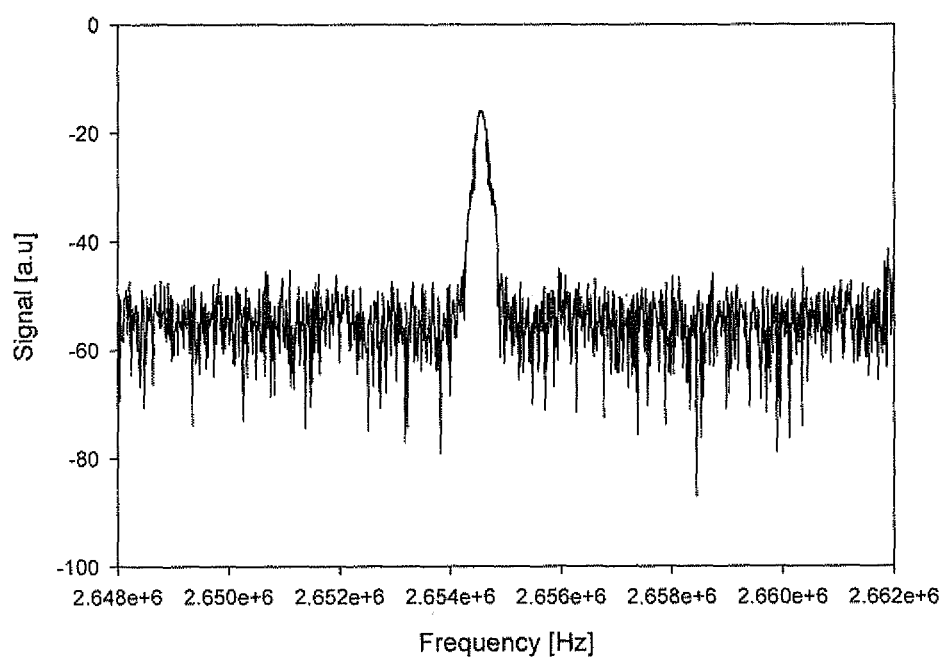
FIG. 8 shows experimental results for the oscillator of FIG. 7.

The device of FIG. 7 has been tested in a real MEMS structure. FIG. 8 shows an experimental spectrum of the device of FIG. 7. The structure used in the analysis was a silicon structure fabricated using the standard MEMS resonator process. During the measurement, a DC current of 3 mA is supplied to the device. The device shows a resonant peak at 2.65 MHz which is corresponding to the in-plane swinging mode of the masses.

Figure 9:
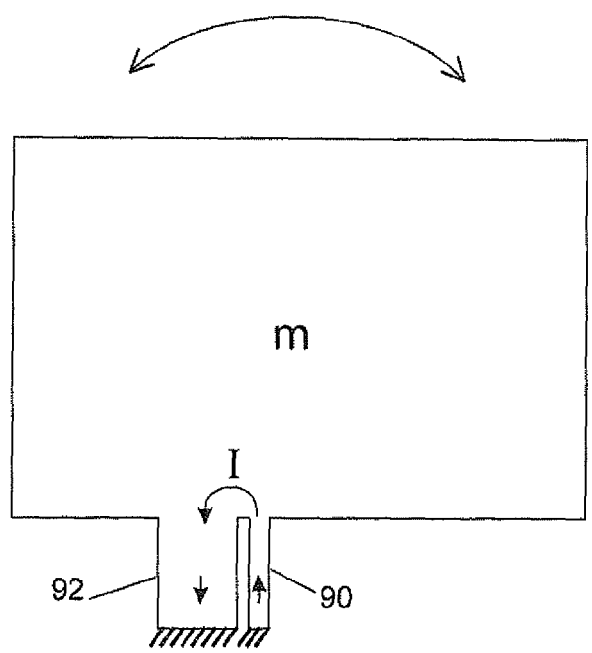
FIG. 9 shows a second example of oscillator which can be used in the circuit of the invention.

A second embodiment is shown in FIG. 9, similar to the first embodiment. The device again consists of a mass and two beams 90,92. However the doping level is the same for the two beams and the mass m (or at least the region close to the connection of the two beams). One beam 92 is made significantly larger than the other one. The wider beam serves as the short connection and the narrower beam 90 serves as the piezoresistive element. Because the wider beam has very small resistance compared to the narrower one, the piezoresistive effect of this beam can be ignored. The position of the mass can be non-symmetric with respect to the beams.

The resonator design outlined above can provide very small, very simply manufacturable oscillators without the need for transistors to sustain the oscillation.

Figure 10:
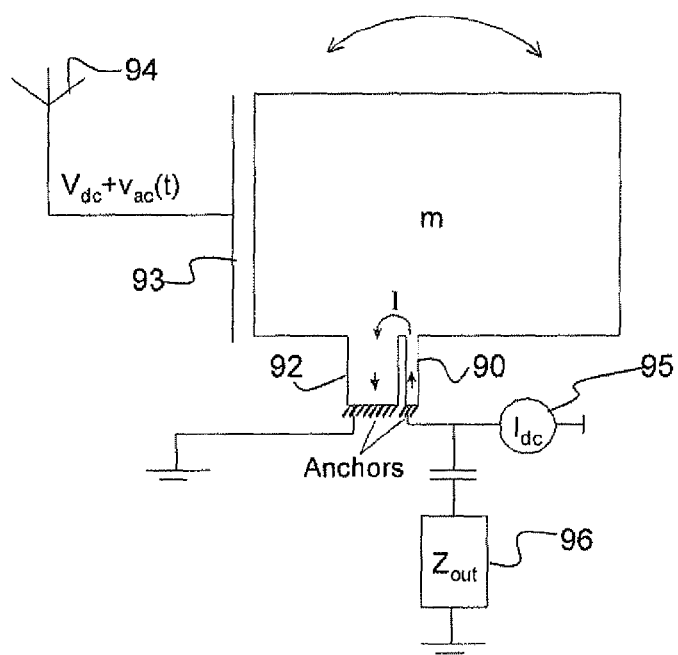
FIG. 10 shows a frequency-selection circuit of the invention based on the oscillator of FIG. 9.

This invention makes use of this oscillator design, and provides the addition of an extra actuation electrode. This extra actuation electrode enables the oscillator to be used as a regenerative detector (or as a super regenerative detector) in a radio or other narrow-band detection system, without using conventional transistors, or vacuum tube amplifiers. A basic schematic of the invention is shown in FIG. 10 based on the oscillator design of FIG. 9.

The actuation or input electrode 93 is coupled to an antenna 94 or other signal source to be sensed. The input preferably comprises an electrode which is electrostatically coupled to the resonator mass, such that an input voltage generates an electrostatic force on the resonator mass. Alternatively, the input can also be coupled by piezoelectric, electrothermomechanical (thermal expansion) force, Lorentz force, magnetostatic force or other electromagnetic forces to the resonator mass.

If electrostatic force is used to couple the input electrode to the resonator mass, a small electrostatic gas or vacuum gap should be made between the input electrode and the resonator mass. This gap distance between the mass and the input electrode should typically be between 50 nm and 3000 nm. The gap spacing can be a parallel plate capacitor, but might also be an electrostatic comb-drive actuator. A DC bias voltage across the gap is needed to ensure that the frequency of the force is equal to the frequency of the input signal.

The piezoresistive element 90 is connected to a dc current source 95 (as actuator) and AC voltage or current detector 96 (as sensor) with impedance Zout, whereas the beam 92 is connected to ground. The actuation force is proportional to the electrical signal vac(t) from the antenna (or other input sensor). If the current Idc is tuned just below the oscillation condition of the mechanical oscillator (between 10% and 0.1% below Iosc), the signals in a frequency band very close to the oscillation frequency of the oscillator will be strongly amplified using the regenerative amplification principle and detected by the detector 96.

The detector comprises an AC voltage or current meter in series with a capacitor. The capacitor prevents DC current from entering the detector. Ideally the detector measures the AC voltage across or current through the piezoresistive element 90 or the sum of the AC voltages across 90 and 92.

Besides detecting the filtered and amplified input signal, it can also be favorable if the signal is demodulated. The input signal might amplitude modulated (AM) or frequency modulated (FM) and needs to be demodulated at the output. To achieve this, use can be made of mixing functions present in the frequency selective device. A discussion of these issues can be found in PCT/IB2009/052614.

In particular, the piezoresistive effect and the electrostatic actuation can be used to mix two signals. The reference above also describes how this mixing functionality can be used to create receiving circuits like I-Q demodulators and superheterodyne receivers. Since the frequency selective device can also mix signals using the piezoresistive or electrostatic elements, the sensitivity and amplification of the circuits can be enhanced by replacing one or more circuit elements by the frequency selective device of this invention. The FM frequency demodulation might also be performed by slope demodulation.

FIG. 11 shows the functionality of the device.

Figure 11A:
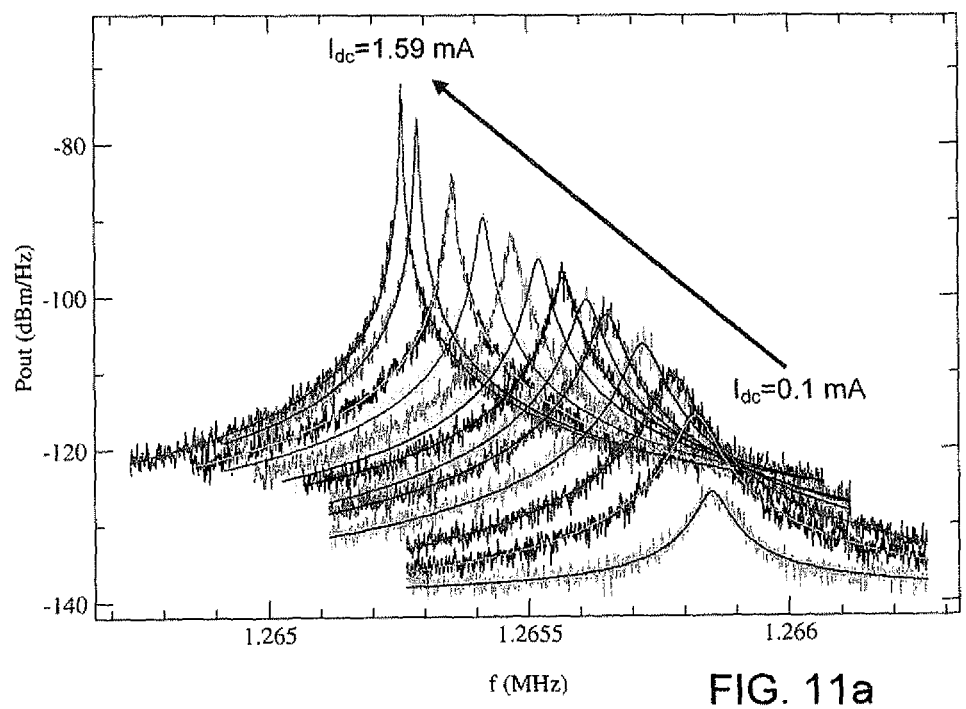
FIGS. 11a and 11b show the experimental frequency response and frequency selectivity of the circuit of FIG. 10 for different drive currents.

FIG. 11a shows a spectrum analyzer measurement of the lever-type device of FIG. 10 at different DC current levels (resonance frequency decreases with increasing current). The vertical axis is the output power in dBm/Hz, and the horizontal axis is the frequency in Hz.

FIG. 11a shows operation of the device as a regenerative detector. The input is an antenna signal with 100 dBm/Hz white noise, unmatched. The frequency tuning of the resonance frequency as a result of temperature variations in the beam is shown. Approximately 30 dB amplification is achieved by the regenerative detector.

To simulate the measurement of an actual signal a constant white noise signal vac(t) is applied on the electrostatic actuation electrode. When increasing the current Idc from 0.1 to 2.8 mA through the resonator, the output signal amplitude is strongly enhanced by more than 50 dB. At the same time the device becomes more frequency selective. The detection frequency shifts slightly at higher currents, mainly as a result of a temperature change which affects the Young's modulus and thus the resonance frequency of the device.

Figure 11B:
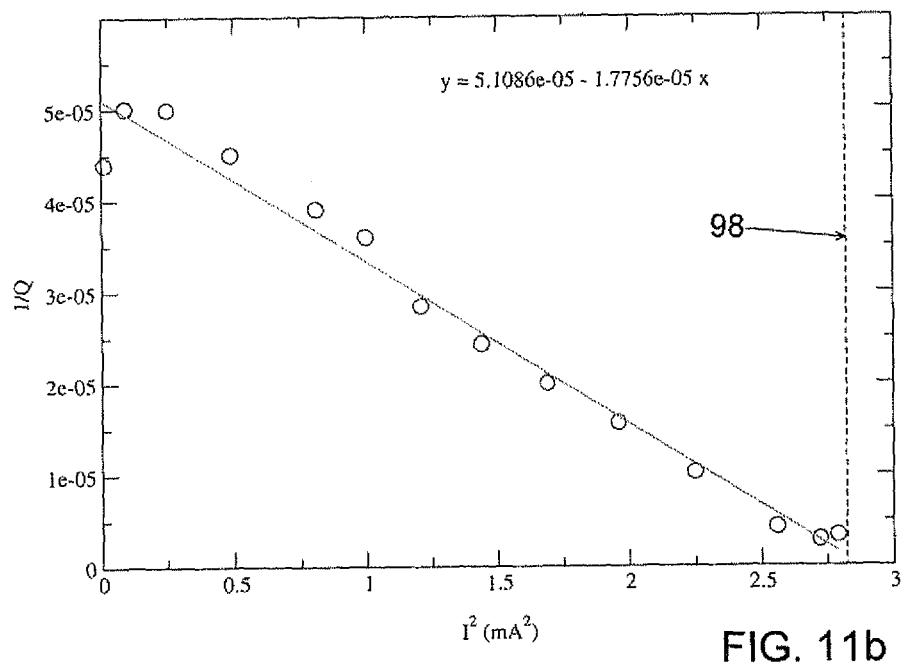

FIG. 11b shows a measurement of the bandwidth or frequency selectivity of the device as a function of squared DC current I2 (1/Q is proportional to the bandwidth). This measurement clearly shows that the device becomes more frequency selective at higher currents. The Q-factor thus increases at larger DC current and reaches ∞ at Idc=1.6 mA. Just below Iosc Q>500,000. The measurements are again on the as shown in FIG. 10.

The line 98 shows the current level at which there is the onset of oscillation in the device, The device of FIG. 10 can function as a super-regenerative frequency selection circuit. For this purpose, a small AC current has to be added to the DC current ($I_{tot}=I_{dc}+I_{ac}$) where the amplitude of $I_{ac}<0.3$ $I_{dc}$. The DC and AC currents are tuned such that the total device sometimes has a negative resistance, but on average has a positive resistance. This can be understood for example from the article "Some recent developments of regenerative circuits", by E. H. Armstrong, Proc. IRE vol. 10. no 8. pp 244-269 (1922).

To satisfy this condition it is required that $I_{tot,max}>I_{osc}$ but that $I_{dc}<I_{osc}$. Moreover the frequency of the AC component of current should be high enough to prevent the device from going into sustained oscillation. On the other hand, the frequency of the AC current should be low to have a large amplification. The super regenerative detection principle can yield even higher gain than regenerative detection. The low-frequency AC current can be generated by an external oscillator.

In one implementation of the invention, this external oscillator is a further MEMS oscillator as described above and which forms the basis of the frequency selection circuit. The external oscillator and the super-regenerative detector can be powered by providing a DC current through both in series, or by applying the same DC voltage source across both in parallel.

Non-linearities in the device can act as a mixer as mentioned above. If the device is in or close to oscillation, the free oscillations of the device can mix with the actuation signal and thus be mixed down to the baseband frequency.

Tuning of the detection frequency can be achieved by adjusting the values of $V_{dc}$ and $I_{dc}$ which will result in a frequency shift as shown in FIG. 11$a$. $V_{dc}$ affects the effective spring constant of the structure and $I_{dc}$ affects the resonance frequency via the temperature dependence of the Young's modulus and by its effect on the spring constant (as shown in the analysis further below). However only small frequency shifts can be achieved in this way.

It is also possible to tune the frequency by adjusting the thermal system (for example by changing the gas pressure, the thermal resistance to ground will decrease). This also becomes clear from the analysis further below. The frequency and amplitude can also be shifted by adjusting the value of $Z_{out}$.

Instead of tuning the radio circuit to the desired frequency range, the circuit can be so small that it becomes possible to line-up many of the circuits in parallel. Each circuit is dedicated for a particular band. The desired frequency band can be switched on or off by switching on the DC current. Since the device can be made extremely small, it becomes feasible to put more than 1000 circuits on a square mm of silicon.

The discussion above has focused on electrostatic actuation. Actuation can also be achieved using other MEMS actuation principles like thermal, magnetic or piezoelectric actuation.

The detection system with impedance $Z_{out}$ can be the input impedance of an additional amplifier. However, the circuit could in principle be directly connected to an acoustic speaker to listen to the desired signal band/channel. If needed, a rectifier can be used to rectify before connecting to the speaker.

This invention is especially useful in applications which require very frequency selective filters with high amplification/sensitivity or filters in which the frequency selectivity (the Q-factor) is tunable.

If many of these resonators are put in parallel, each of them has a slightly different resonance frequency (e.g. f=f0+n*df, with n=0-100) the filter characteristic becomes tunable by adjusting the DC current through each of the elements. Alternatively the output of each of the resonators is connected to a separate output (channel). The desired radio channel can simply be selected. If the radio signal is strong and nearby enough in frequency, it is possible to 'lock' the oscillator to a radio signal. This way it is possible to synchronize clocks using a single transmitter.

Possible applications that might use the invention are FM or AM radios, Bluetooth receivers, GPS receivers, Wireless sensor networks.

The invention provides a simple, low cost and small radio circuit. It can be extremely narrowband (effective $Q_{eff}$>1,000,000) and high gain. It also has the potential of low-power operation. It therefore has a very interesting application potential, especially in low-cost radio markets.

The invention can be applied to many different oscillator designs. Some further embodiments of oscillator design will first be described, followed by a mathematical analysis of the function of the circuit of the invention.

Figure 12A:
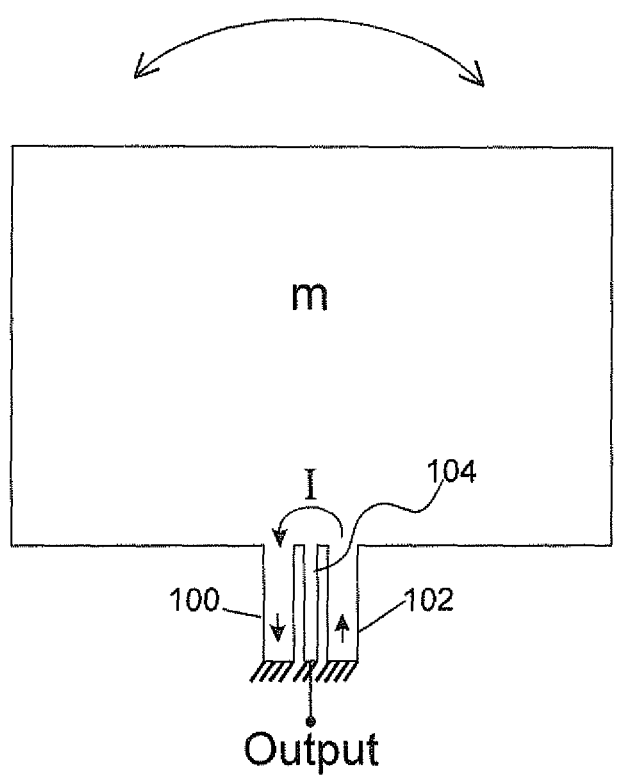
FIGS. 12a to 12c show third examples of oscillator which can be used in the circuit of the invention.
Figure 12B:
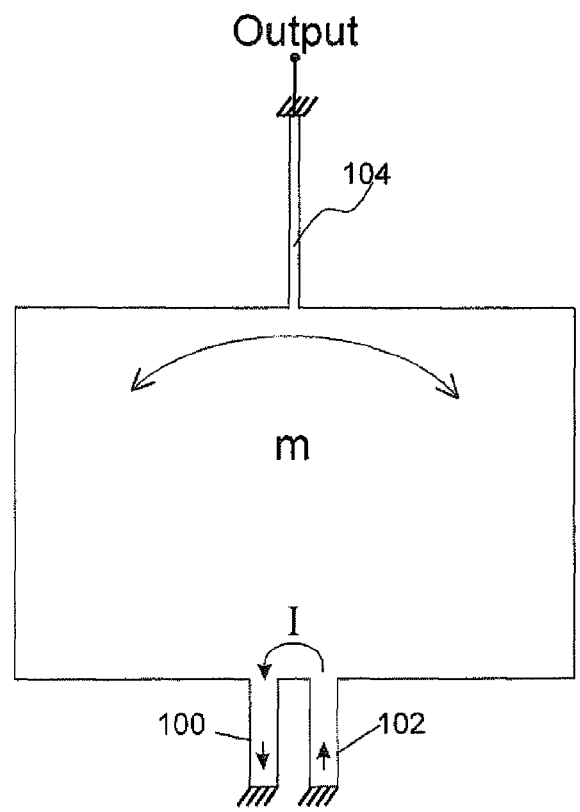
Figure 12C:
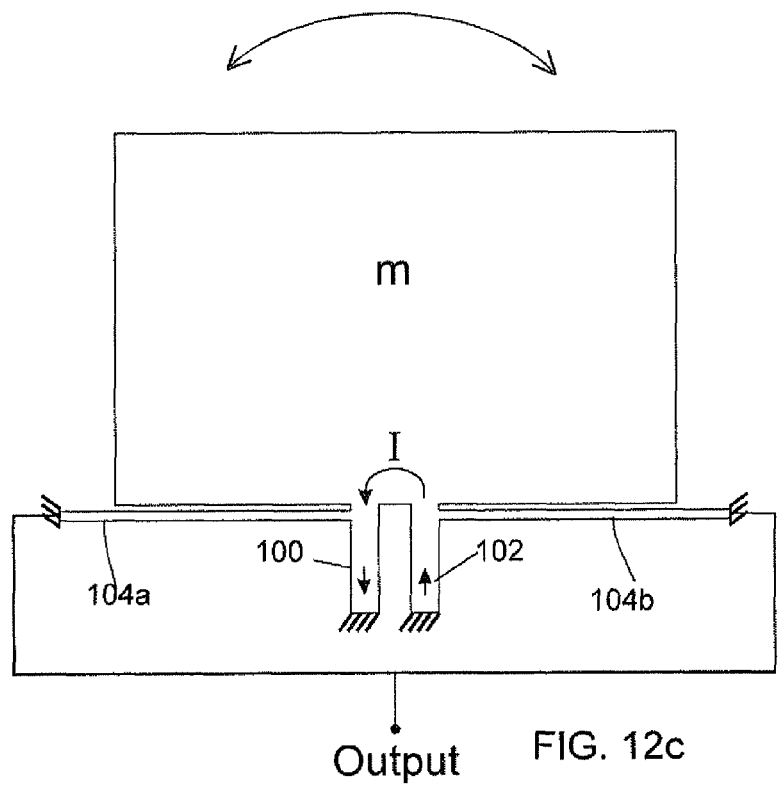

A third embodiment of oscillator shown in FIG. 12$a$ is a further extension of the previous embodiments. Instead of having a single piezoresistive element, two piezoresistive elements 100, 102 are arranged on both sides of a middle beam 104. The whole structure can be doped at the same level, such as to produce a negative gauge factor. A DC current flows from one piezoresistive element to the other (either constant voltage or constant current). The middle beam should not draw any current and is only used to sense the voltage change at the point in between the piezoresistive elements. Thus, the middle beam functions as a voltage output tap.

Electrically, the two piezoresistive elements are connected in series. During vibration (in the swinging mode) the two piezoresistive elements are alternatively compressed and stretched and therefore according to the principle they alternatively push and pull back to the mass, such as to maintain the oscillation. Because the resistance of the piezoresistive elements are changing in anti-phase, their total resistance is substantially constant, leading to a constant current in the elements, regardless of whether a constant voltage or a constant current is applied from outside. The readout circuit can be considered a half Wheatstone bridge in which the voltage at the middle beam is changing with the vibration and can be used as the output signal.

FIG. 12$b$ shows a further extension of the third embodiment. The middle beam 104 is now positioned at the top side of the mass, in the central position. This arrangement is more preferred in the case when two identical structures are placed back-to-back in the symmetrical configuration. In this case it is difficult to connect this beam to outside if the beam is positioned in between the two piezoresistive elements 100 and 102. The middle beam 104 is preferred to be a thin and long beam in order to minimize the energy loss through the anchor connecting this beam to the substrate, thus maximizing the Q factor.

FIG. 12$c$ shows yet another extension of the third embodiment. The middle beam 104 as in the third embodiment is now replaced by two small beams 104$a$,104$b$ which are symmetrically attached to the ends of the piezoresistive elements close to the mass. These beams are also anchored to the substrate and they are electrically connected to the output port of the device. The beams are also thin and long in order to minimize the energy loss, thus maximize the Q factor. In addition, because the attachment points of the beams at the piezoresistive elements are close to the rotation point of the structure, the energy loss through those beams are further reduced.

Figure 13:
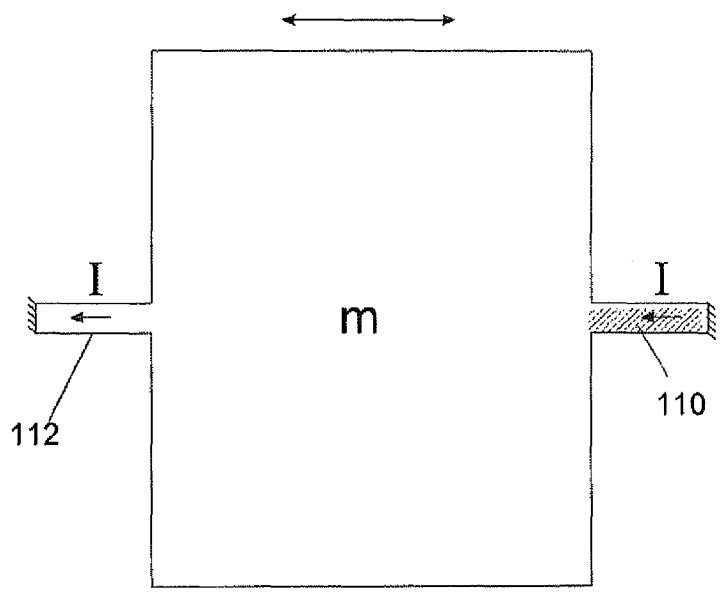
FIG. 13 shows a fourth example of oscillator which can be used in the circuit of the invention.

A fourth embodiment of FIG. 13 has the resonator mass m and two beams which are attached to the mass at two opposite sides. In the vibration mode of interest the mass translates sideways, that alternatively compresses and stretches the beams in their longitudinal direction. One of the beams 110 is lowly doped and serves as the piezoresistive element and the other beam 112 and the mass is highly doped to make a short connection between the piezoresistive element and the other anchor.

In order to actuate the oscillation and output the signal for detection, a DC current is allowed to flow from one anchor to the other. The spring stiffness in this case is the sum of the stiffnesses of both beams in the longitudinal direction. The readout method is the same as for the example of FIG. 6, based on voltage detection.

Figure 14:
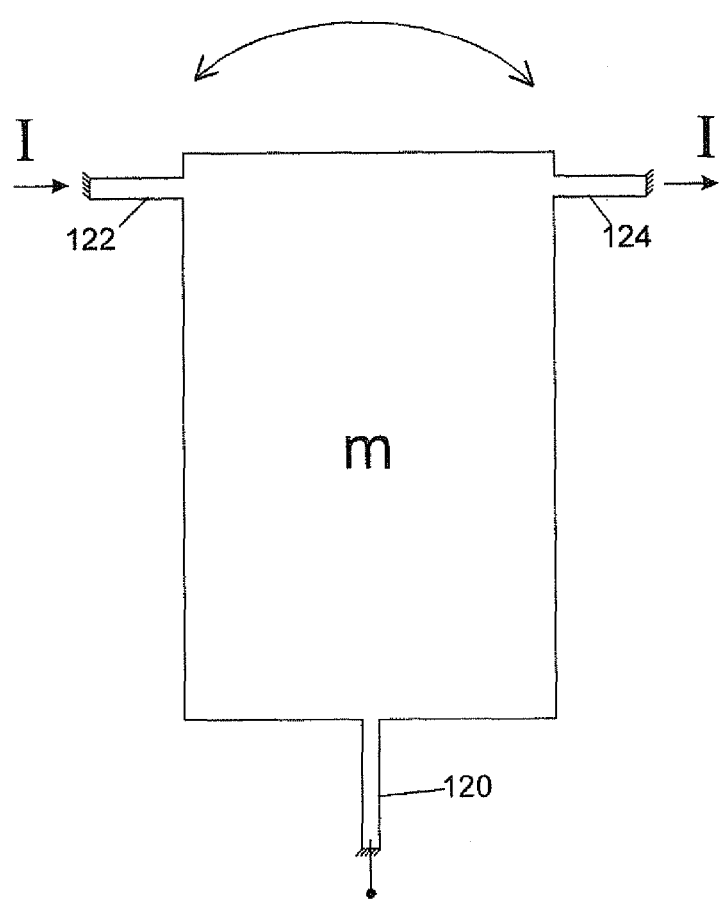
FIG. 14 shows a fifth example of oscillator which can be used in the circuit of the invention.

The embodiment of FIG. 14 has the resonator mass m with three beams connected at three different sides of the mass. The vibration mode of interest is the swinging mode with the rotation point at somewhere near the middle beam 120. The stiffness associated with this vibration mode is contributed by all three beams. The whole structure is doped with the same level. The beams 122,124 on the left and right sides of the mass act as the piezoresistive elements and the middle beam is used to pick up the output signal. A constant current I is sent from one piezoresistive element to the other. When the mass vibrates, the two piezoresistive elements are alternatively compressed and stretched. That means the mass is actuated using a push-pull approach. At the middle beam, a voltage change is present which can be used as the output signal to the detector.

Figure 15:
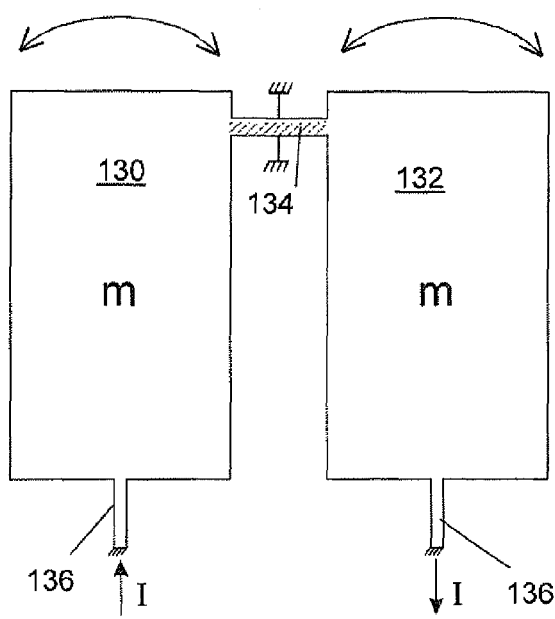
FIG. 15 shows a sixth example of oscillator which can be used in the circuit of the invention.

The device in the embodiment of FIG. 15 has two mass-spring structures 130,132 connected to each other by a piezoresistive element 134. Each structure has another beam 136 at the lower side (of the Figure) that connects the mass to the substrate. In the mode of interest, the two masses swing in anti-phase and the middle point of the piezoresistive element is stationary. To ensure that the right mode is excited, the middle point of the piezoresistive can be anchored as shown, but should stay electrically isolated. The piezoresistive beam is lowly doped (to have the piezoresistive effect) and the rest is highly doped (to make a short circuit).

During operation, a DC current is sent from one beam, through the piezoresistive element and the mass bodies, to the other beam. The piezoresistive element contracts and extends that drives the two masses into the anti-phase swinging mode. The output signal can be obtained from the voltage change (when a constant current is used) or the current change (when a constant voltage is used).

Figure 16:
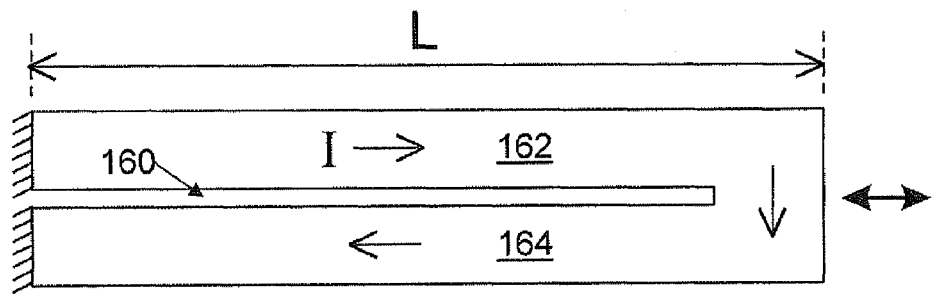
FIG. 16 shows a sixth example of oscillator which can be used in the circuit of the invention.

The design shown in FIG. 16 resembles a clamped-free resonator structure but it has a slit 160 along the middle of the beam, dividing the beam into two legs 162,164. At the tip (free end) of the beam the two legs are still connected. A DC current can flow from one leg of the beam to the other leg. The vibration mode in this case is the longitudinal bulk acoustic wave (BAW) mode in which the mass and the spring are merged inside the same structure. The piezoresistive elements are the legs of the structure, which can resonate itself in the BAW mode.

The BAW mode resonance frequency of the structure is given by:

$$\omega_0 = \frac{\pi}{2L}\sqrt{\frac{E}{\rho}} \quad (21)$$

in which L is the length of the structure. Combining Eq. (21) with Eq. (19) gives a characteristic resonance frequency $\omega_{th}$ for Si, $$\omega_{th} = \frac{\pi^2}{16}\frac{c_s E}{\kappa} \quad (22)$$

Assuming E=130 GPa for (100) direction, $\kappa$=100 $Wm^{-1}K^{-1}$ (at RT), $c_s$=850 $Jkg^{-1}K^{-1}$ (at RT), $\rho$=2330 $kg/m^3$, results in $f_{th}=\omega_{th}/2\pi$=89 GHz and characteristic length L=21 nm.

Figure 17:
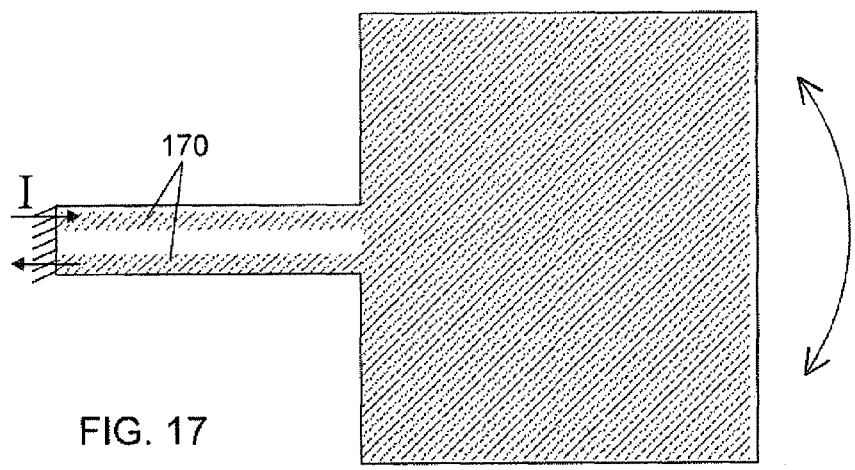
FIG. 17 shows a seventh example of oscillator which can be used in the circuit of the invention.

In all the embodiments above, the piezoresistive elements mainly work in the longitudinal mode, i.e. they are longitudinally compressed and extended. In $kg/m^3$, results in $f_{th}=\omega_{th}/2\pi$=89 GHz and characteristic length L=21 nm. the embodiment of FIG. 17, bending piezoresistive elements can also work if the doping scheme of the elements can be specially designed.

A beam can be considered to have a deformation which has a significant bending component with a radius of curvature R. In this case the center line of the beam will have zero strain. The outer radius will have tensile strain and the inner radius will have compressive strain. The edges of the beam are analogous to the separate beams in FIG. 6. To use the edges to form the piezoresistive elements, the edges 170 of the beam are doped which serve as the piezoresistive elements and middle part of the beam is be un-doped to electrically separate the edges.

The device works in the push-pull mode, meaning that the edges of the beams are alternatively compressed and extended. This makes the beam alternatively bending in both sides.

The invention makes use of a simplified oscillator structure. A complete oscillator can be realized within one single MEMS structure, without having to use any external circuit. There is no need for transduction gaps and high DC voltage. Only a small current is needed to actuate the device and to provide an output signal. The device is compatible with silicon process technology. Thus, the device manufacture can be very simple, since the device can be a structure made of only one uniform material with piezoresistive properties (e.g. silicon). The resonance frequency can be controlled by design, compatible with silicon process technology, and high linearity of the elements can be achieved (no transistors needed), with high Q-factor.

A mathematical analysis and explanation of the operation of the frequency selection circuit will now be given, in particular the regenerative detector functionality.

Figure 18:
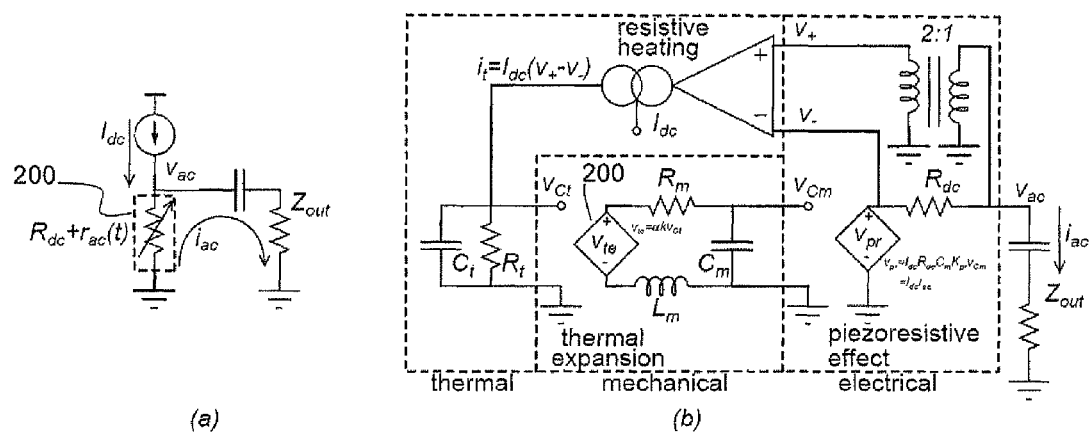
FIG. 18 shows a schematic circuit diagram and a detailed circuit diagram for the oscillator device which can be used in the circuit of the invention.

FIG. 18 shows an equivalent circuit of the MEMS oscillator of FIG. 9.

FIG. 18(a) shows schematically the connections of the circuit. A DC current IDC is driven through the MEMS device 200, while a measurement device which is capacitively coupled and has an internal impedance Zout is connected to a terminal of the MEMS crystal. The MEMS oscillator acts as a time-dependent resistor. The MEMS oscillator consists of a mass, damper and spring which are shown in the mechanical domain part of FIG. 3. The spring also functions as a transducer element through which the DC current is driven. The equivalent circuit representing the piezoresistive effect, thermal heating and thermal expansion effects in the transducer element is shown in FIG. 18(b).

FIG. 18(b) separates the circuit into the mechanical domain, electrical domain and thermal domain, and these are discussed in turn:

Mechanical Domain

In the mechanical domain, the differential equation governing the resonance mode of the device can be described by a mass m, damper b, spring k system, or by an equivalent inductor $L_m$, resistor $R_m$ and capacitor $C_m$ as is indicated by equation (23).

$$m\ddot{x} + b\dot{x} + kx = F_{thermal} = \alpha kT \quad (23)$$

$$L_m\ddot{q}_m + R_m\dot{q}_m + \frac{q_m}{C_m} = \alpha k v_{Ct}$$

The charge $q_m$ in the electrical circuit represents the position x, the current $i_m$ the speed and the voltages $v_m$ represent the forces on the elements. The thermal expansion effect in the transducer element is represented by a voltage-controlled voltage-source with output voltage $v_{te}$, which generates a thermal expansion force proportional to the temperature $T=v_{Ct}$.

The representation of the thermal expansion effect by a voltage-controlled voltage-source neglects thermoelasticity effects. This is a good approximation because the thermoelastic power in the thermal domain is much smaller than the power leaking away through the thermal resistor $R_t$ and because thermoelastic damping of the mechanical system is taken into account in the value of the mechanical damping resistor $R_m$.

Electrical Domain

The piezoresistive effect converts the extension of the spring x to a relative change in resistance, so $r_{ac}/R_{dc}=K_{pr}x=K_{pr}q_m=K_{pr}C_mv_{Cm}$. Because there is a current $I_{dc}$ running through the resistor, this effect can be represented by a voltage-controlled voltage-source, with an output voltage: $v_{pr}=I_{dc}r_{ac}=I_{dc}R_{dc}K_{pr}C_mv_{Cm}$. This piezoresistive voltage generates an AC current ac which depends on the impedance of the detector $Z_{out}$, and generates an output voltage $v_{ac}$ across this resistor. The voltage and current across the transducer element result in a resistive heating power $P_{dc}+p_{ac}=(V_{dc}+v_{ac})(I_{dc}-i_{ac})$, and because $i_{ac}=(v_{pr}-v_{ac})/R_{dc}$ and $V_{dc}=I_{dc}R_{dc}$ a thermal heating power $p_{ac}=I_{dc}(2v_{ac}-v_{pr})$ follows, which is represented in the FIG. 18(b) by a transformer with an operation transduction amplifier.

Thermal Domain $$C_t\frac{dT}{dt} + \frac{T}{R_t} = p_{ac} \quad (24)$$

$$C_t\frac{dv_{Ct}}{dt} + \frac{v_{Ct}}{R_t} = i_t$$

The heat capacity $C_t$ can be represented by a capacitor and the heat resistance by a resistor $R_t$. The voltage across the heat capacitor $v_{Ct}$ represents the AC temperature T, as can be seen from equation (24). The thermal power is represented by a current $i_t=p_{ac}$. The thermal expansion effect closes the feedback loop.

The circuit in FIG. 18(b) can be simplified to a single differential equation in the mechanical domain where the mechanical resonator is driven by the feedback from the thermal expansion. If the motion is approximated by $x=x_0\text{Re}(e^{i\omega t})$ this yields:

$$m\ddot{x} + b\dot{x} + kx = F_{thermal} = \beta(1 - i\omega R_tC_t)x \quad (25)$$

$$\beta =$$

$$\frac{\alpha k R_t I_{dc}^2 R_{dc} K_{pr}}{1+(\omega R_tC_t)^2}\left(\frac{2Z_{out}}{R_{dc}+Z_{out}} - 1\right) - m\omega^2 + i\omega(b+\beta R_tC_t) + (k-\beta) =$$

$$-m\omega^2 + i\omega b^* + k^* = 0$$

This shows that the differential equation governing the linear system with feedback is similar to that of the damped harmonic oscillator. The feedback via the electrical and thermal domains modifies the effective damping constant and the spring constant, which become $b^*=b+\beta R_tC_t$ and $k^*=k-\beta$. The coefficient $\beta$ can also be negative, either because the piezoresistive constant $K_{pr}$ is negative, or because the output impedance $Z_{out}$ is smaller than $R_{dc}$. This will reduce the effective damping constant $b^*$. The amount by which $\beta$ is negative can be increased by increasing $I_{dc}$. At a critical value of $I_{dc}$, $b^*$ will become negative and the device will start to oscillate, because the positive intrinsic damping b of the resonator is compensated by the negative damping of the feedback loop. The phase shift generated in the thermal domain by the thermal capacitor and the thermal resistor is required for oscillation, because the oscillation conditions of an oscillator require a phase shift of 90 degrees in addition to sufficient loop-gain.

Figure 19:
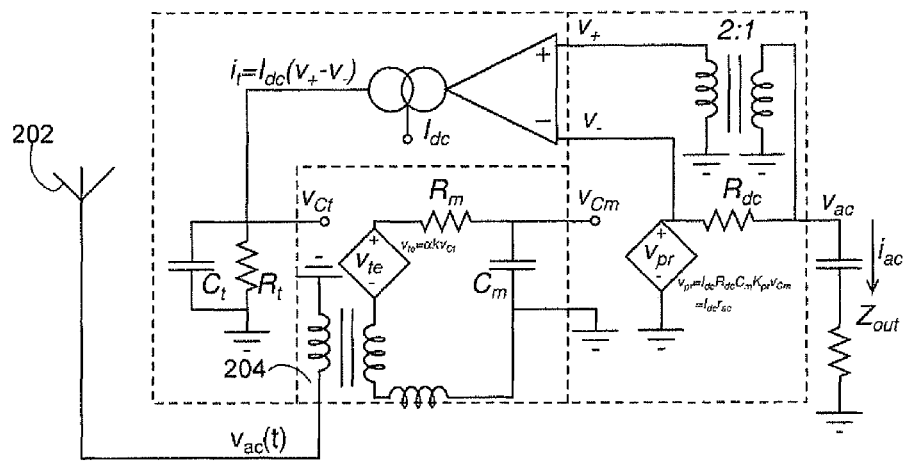
FIG. 19 shows a detailed circuit diagram for the circuit of the invention.

FIG. 19 is a circuit diagram to show the operation of the circuit of the invention of FIG. 10. The circuit diagram adds to FIG. 18(b) the antenna 202 and additional actuation electrode 204.

Since the circuit of FIG. 19 has positive feedback, the input signal is strongly amplified by the regenerative detection circuit, especially if $I_{dc}$ is close to the oscillation condition.

The efficiency of the circuit can be tuned by adjusting the output impedance $Z_{out}$.

Various modifications to the oscillator design are possible. For example, all materials that posses the piezoresistive effect can be used to form the oscillator feedback element. The piezoresistive effect exists in many metals, metal alloys and semiconductors. The effect in semiconductors is much larger than that in metals and metal alloys (although metals are used in strain gauges). Examples of metals and metal alloys are: platinum, nickel, constantan (copper-nickel alloy), nichrome V (nickel-chrome alloy), platinum alloys (usually tungsten), isoelastic (nickel-iron alloy), or karma-type alloy wires (nickel-chrome alloy). Although the device has been described as formed from silicon, other semiconductors can be used. Examples of suitable semiconductors are Si, Ge, SiGe, SiC, III-V type of semiconductors such as: GaAs, InSb, InAs.

In all examples above, the actuation electrode is preferably close to a side of the resonator which has maximal amplitude. The feedback piezoresistive element can be made of silicon nanowires or carbon nanotubes which have large piezoresistive coefficients, instead of being formed of bulk silicon.

The detector can connected to an antenna such that the reading of the detector can be wirelessly transmitted.

Various other modifications will be apparent to those skilled in the art.

The invention claimed is:

1. A frequency selection device, comprising:
a resonator mass which is connected by a spring arrangement to a substrate;
a feedback piezoresistive element for controlling a response of motion of the resonator mass to an input signal connected to the resonator mass and which is arranged such that the strain in the feedback piezoresistive element varies in response to movement of the resonator mass, and a change in strain in the feedback piezoresistive element causes a change in electrical resistance;
means for driving a current through the feedback piezoresistive element to control the response of the motion of the resonator mass to force generated from the input signal;

an input for coupling the input signal from which a range of desired frequencies is to be selected to the device such as to influence the motion of the resonator mass;

a detector exhibiting an impedance (Zout) for detecting an output signal amplified and filtered by the resonator mass by measuring a change in voltage across or current through the feedback piezoresistive element for detecting said change in electrical resistance;

a capacitor, electrically connected in series with the detector, for preventing DC current from entering the detector; and an antenna, wherein the input is coupled to the antenna for receiving the input signal, and the input signal is amplitude modulated (AM) or frequency modulated (FM) and needs to be demodulated when being outputted;

wherein the means for driving the current through the feedback piezoresistive element generates a dc current with a superposed ac component; and wherein amplitude of the superposed ac component is smaller than 0.3 times of amplitude of the dc current.

2. The device as claimed in claim 1, wherein the means for driving the current comprises a current or voltage source for supplying a current or voltage to the feedback piezoresistive element.

3. The device as claimed in claim 2, wherein the resonator mass is connected to the substrate by at least two arms which together form the spring arrangement, wherein a first arm comprises the feedback piezoresistive element and a second arm comprises a current return path for the current supplied by the current or voltage source.

4. The device as claimed in claim 3, wherein the first, the feedback piezoresistive element, arm is doped with a first doping level, and the second arm is doped with a second, higher doping level.

5. The device as claimed in claim 3, wherein the first, the feedback piezoresistive element, arm is smaller in cross section than the second arm.

6. The device as claimed in claim 1, wherein the resonator mass and the feedback piezoresistive element comprise a single body.

7. The device as claimed in claim 1, wherein the input comprises an electrode which generates a force on the resonator mass, the force depending on the input signal.

8. The device as claimed in claim 1, wherein the dc current level is selected below the current corresponding to sustained oscillation of the resonator mass and the desired frequency range comprises a resonance frequency of the resonator mass.

9. The device as claimed in claim 1, wherein the resonator mass and the spring arrangement comprise a single body.

10. The device as claimed in claim 1, wherein the resonator mass comprises a silicon body.

11. A radio receiver circuit comprising the frequency selection device as claimed in claim 1.

12. The radio receiver comprising a plurality of radio receiver circuits as claimed in claim 11, each designed for a different desired frequency range.

13. The device as claimed in claim 1, wherein the device acts as a regenerative circuit such that an electronic signal is amplified multiple times by the piezoresistive element.

14. The device as claimed in claim 1, wherein the device acts as a regenerative circuit such that an electronic signal is filtered multiple times by the resonator mass.

15. A method of selecting and amplifying a desired frequency range from an input signal, comprising:

driving a current through a piezoresistive element;

controlling motion of a resonator mass using the piezoresistive element, which is arranged such that strain in the piezoresistive element varies in response to movement of the resonator mass, and a change in the strain in the piezoresistive element causes a change in electrical resistance;

coupling the input signal from which a desired frequency range is to be selected to a frequency selection device such as to influence the motion of the resonator mass; and detecting a signal amplified and filtered by the frequency selection device by measuring change in voltage across or current through the piezoresistive element for detecting said change in electrical resistance, wherein the detecting comprises preventing DC current from entering a detector used for performing the detecting, wherein the input signal is received by an antenna, and wherein the input signal is amplitude modulated (AM) or frequency modulated (FM) and needs to be demodulated when being outputted;

wherein the driving the current through a piezoresistive element comprises generating a dc current with a superposed ac component; and wherein amplitude of the superposed ac component is smaller than 0.3 times of amplitude of the dc current.

16. The method as claimed in claim 15, wherein the detecting comprises the measurement of a voltage or current across the piezoresistive element.

17. The method as claimed in claim 15, further comprising amplifying an electronic signal multiple times with the piezoresistive element.

18. The method as claimed in claim 15, further comprising filtering an electronic signal multiple times with the resonator mass.

* * * * *